United States Patent
Kim et al.

(10) Patent No.: US 9,133,353 B2
(45) Date of Patent: Sep. 15, 2015

(54) LOW TEMPERATURE CURABLE POLYIMIDE RESIN AND METHOD OF PREPARING THE SAME

(75) Inventors: Sang Woo Kim, Daejeon (KR); Se Jin Shin, Daejeon (KR); Dong Hyun Oh, Daejeon (KR); Kyung Jun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/182,012

(22) Filed: Jul. 13, 2011

(65) Prior Publication Data

US 2012/0016076 A1    Jan. 19, 2012

(30) Foreign Application Priority Data

Jul. 14, 2010 (KR) .................. 10-2010-0067847
Dec. 29, 2010 (KR) .................. 10-2010-0138064

(51) Int. Cl.
| | |
|---|---|
| C09D 11/101 | (2014.01) |
| C08G 73/10 | (2006.01) |
| G03F 7/023 | (2006.01) |
| G03F 7/00 | (2006.01) |

(52) U.S. Cl.
CPC ............ *C09D 11/101* (2013.01); *C08G 73/105* (2013.01); *C08G 73/1032* (2013.01); *C08G 73/1039* (2013.01); *C08G 73/1067* (2013.01); *G03F 7/0233* (2013.01); *G03F 7/0007* (2013.01)

(58) Field of Classification Search
USPC ................................................. 528/351, 353
See application file for complete search history.

(56) References Cited

U.S. PATENT DOCUMENTS

| 3,422,064 A | * | 1/1969 | Gall ............................... 528/126 |
| 5,723,571 A | * | 3/1998 | Oka et al. ....................... 528/353 |
| 5,750,633 A | * | 5/1998 | Ohara et al. ................... 528/174 |
| 6,677,099 B1 | * | 1/2004 | Ishii et al. ..................... 430/165 |
| 2011/0003248 A1 | * | 1/2011 | Jung et al. .................. 430/270.1 |
| 2011/0046277 A1 | * | 2/2011 | Jo et al. ......................... 524/107 |

FOREIGN PATENT DOCUMENTS

| CN | 1402841 A | 3/2003 |
| CN | 1576293 A | 2/2005 |
| CN | 1639262 A | 7/2005 |
| JP | 2009-004394 A | 1/2009 |
| JP | 2009-126938 A | 6/2009 |
| KR | 10-2003-0009327 A | 1/2003 |
| KR | 10-2004-0071778 A | 8/2004 |
| KR | 10-2005-0001408 A | 1/2005 |
| WO | 2006/077964 A2 | 7/2006 |

OTHER PUBLICATIONS

H. Ju et al.: "Synthesis and Optical Nonlinearity of Thermally Stable Polyimides Incorporated with Electro-Optic Chromophore as Side Chain," Macromol. Symp., 2007, vol. 249-250, pp. 21-28.

* cited by examiner

*Primary Examiner* — Tae H Yoon
(74) *Attorney, Agent, or Firm* — Rothwell, Figg, Ernst & Manbeck, P.C.

(57) ABSTRACT

In a method for preparing a polyimide resin by reacting diamine and dianhydride, the polyimide resin is polymerized under the presence of a solvent having a boiling point ranging from 130° C. to 180° C. so as to be curable at a low temperature ranging from 150° C. to 250° C. Because the polyimide is curable even at a low temperature, when the polyimide resin is used as an electronic material, damage to equipment due to an otherwise high temperature process can be minimized, and in addition, the polyimide resin can be extensively used as an electronic material such as for a plastic substrate, or the like.

6 Claims, 2 Drawing Sheets

LOW TEMPERATURE CURABLE POLYIMIDE RESIN AND METHOD OF PREPARING THE SAME

CROSS REFERENCE TO RELATED APPLICATIONS

This application claims priority from Korean patent application No. 10-2010-0067847 filed on Jul. 14, 2010, and Korean patent application No. 10-2010-0138064 filed on Dec. 29, 2010, all of which are incorporated herein by reference in their entireties for all purposes.

BACKGROUND OF THE INVENTION

1. Field of the Invention

The present invention relates a polyimide resin and a preparation method thereof and, more particularly, to a low temperature curable polyimide resin and a method of preparing the same.

2. Description of the Related Art

Recently, as the move for high integration, high density, high reliability, high speed, and the like, of electronic devices has been rapidly spreading in the field of semiconductor devices based on semiconductor and a liquid crystal display device, research into the use of the advantageous of an organic material easily available for processability, high purity, and the like, is actively ongoing.

In particular, a polyimide resin has many advantages that, besides its high heat resistance, excellent mechanical strength, low permittivity, high insulation characteristics, it has good polarization characteristics of a coated surface, has a very low content of impurity degrading the reliability of an element, and can be easily configured to have a fine form, so the use of a photosensitive insulating layer including a photosensitive resin including the polyimide resin is extending even to a display sector.

In order to synthesize polyimide, generally, a diamine component and a dianhydride component are polymerized in a polar organic solvent such as N-methyl-2-pyrolidone (NMP), dimethylacetamide (DMAc) and dimethylformamide (DMF) through 2-stage condensation polymerization to obtain a polyimide precursor solution, and the obtained polyimide precursor solution is coated on silicon wafer, glass, or the like, and then thermally treated at a high temperature so as to be cured (or hardened).

A commercialized polyimide product for an electronic material is supplied in a state of a polyimide precursor solution or a polyimide film, and in the field of a semiconductor device, the polyimide produce is largely supplied in the state of a polyimide precursor solution.

However, the method of preparing the polyimide polymer requires a high curing temperature (i.e., 300° C. or higher), having a problem in that it cannot be used for a process vulnerable to heat. In addition, although the polyimide precursor solution undergoes the high temperature curing operation, it cannot be completely changed into polyimide.

Thus, in an effort to solve this problem, a polymerization method of performing chemical imidizing in a liquid state by using a catalyst has been developed; however, this method also uses a high boiling point solvent as well as it requires the high temperature process, so after the polymerization process, the high temperature curing process must be performed again in order to remove the solvent.

In addition, when a high temperature thermal treatment is intended to be performed to prepare the polyimide resin, large-scale heat equipment is required to enhance production efficiency.

SUMMARY OF THE INVENTION

The present invention was devised to solve the problems of the related art, and inventors of the present application noted that polyimide can be prepared at a low temperature by using a low boiling point solvent or adding an amine-based catalyst having a low boiling point and high reactivity along with the low boiling point solvent in the preparation process of polyimide, and complete the present invention upon confirming the fact that the thusly prepared low temperature polyimide still has the excellent qualities of heat resistance and processability.

Therefore, an object of the present invention is to provide a method for preparing a polyimide resin which can be imidized even at a low temperature by using a low boiling point solvent.

Another object of the present invention is to provide a method for preparing a polyimide resin which can be imidized even at a low temperature by using a particular catalyst having a low boiling point and high reactivity along with the low boiling point solvent.

Still another object of the present invention is to provide a photosensitive composition and an ink composition for printing including the polyimide resin.

Yet another object of the present invention is to provide a polyimide resin curable at a low temperature.

In order to accomplish the above objects, there is provided a method for preparing a polyimide resin, including: polymerizing a polyimide resin using a solvent having a low boiling point ranging from 130° C. to 180° C.

The low boiling point solvent may be one or more selected from the group consisting of diethyleneglycol methylethylether, diethyleneglycol dimethylether, diethyleneglycol diethylether, dipropyleneglycol dimethylether, methyl 3-methoxy propionate, ethyl 3-ethoxy propionate, propylene glycol methylether propionate, dipropyleneglycol dimethylether, cyclohexanone, and propyleneglycolmonomethyletheracetate (PGMEA).

The low boiling point solvent may be contained by 20 weight parts to 2000 weight parts over a 100 weight parts of monomer for preparing a polyimide resin.

A polyimide resin may be directly prepared without performing a polyamic acid precursor preparation operation.

The polyimide resin may be prepared under the presence of a catalyst having a boiling point ranging from 60° C. to 100° C.

The catalyst may be one or more selected from the group consisting of N, N-diethylmethylamine, N,N-dimethylisopropylamine, N-methylpyrrolidine, pyrrolidine, and triethylamine.

The catalyst may be contained by 0.5 weight parts to 30 weight parts over 100 weight parts of diamine and dianhydride, starting materials of the polyimide resin.

The polymerization may be performed at a temperature ranging from 120° C. to 200° C.

The polyimide resin may use, as a starting material, one or more aromatic diamines selected from the group consisting of bivalent organic groups including a phenolic hydroxyl group, a carboxyl group, or a hydroxyl group, such as bivalent organic groups derived from

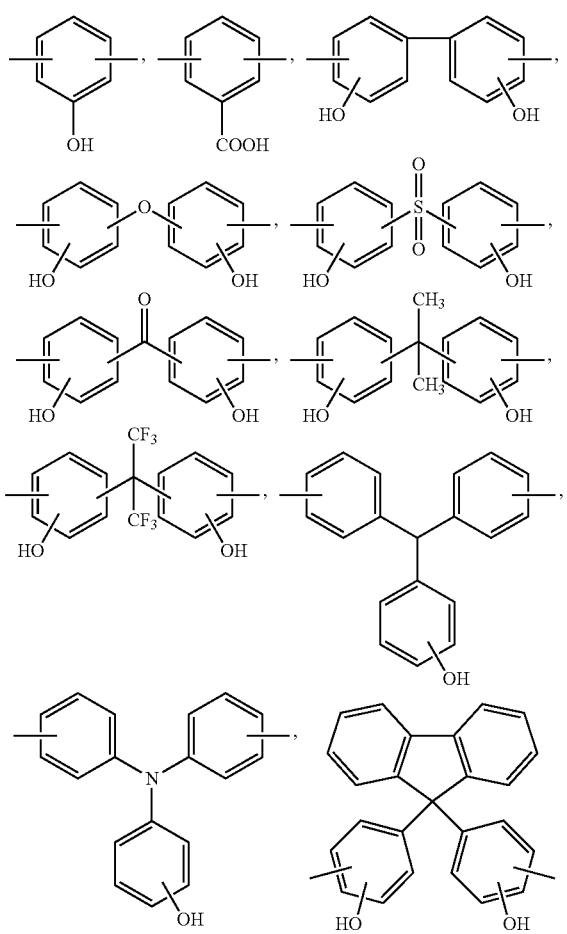

and a 3,5-diaminobenzoic acid; one or more aromatic diamines selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminophenylmethane, 3,3'-diaminodiphenylmethane, 4,4'-methylene-bis(2-methylaniline), 4,4'-methylene-bis(2-isopropyl-6-methylaniline), 4,4'-methylene-bis(2,6-didsopropylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-amoniphenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane, and one or more aliphatic diamines selected from the group consisting of 1,6-hexanedimane, 1,4-cyclohexanediamine, 1,3-cyclohexanedimane, 1,4-bix(aminomethyl)cyclohexane, 1,3-bis(aminomethyl) cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy) ethane, bis(3-aminopropyl)ether, 1,4-bis(3-aminipropyl) piperazine, 3,9-bis(3-amonopropyl)-2,4,8,10-tetraoxaspiro [5,5]undecane, and 1-3-bis(3-aminopropyl) tetramethyldisiloxane.

The polyimide resin may use, as a starting material, one or more dianhydrides selected from the group consisting of one or more acid anhydrides selected from the group consisting of anhydrous pyromellitic acid, 3,3',4,4'-biphenyltetracarboxylic acid dianhydride, butane-1,2,3,4-tetracarboxylic acid dianhydride, 3,3',4,4'-benzophenonetetracarboxylic acid dianhydride, 3,3'4,4'-diphenylethertetracarboxylic dianhydride, 3,3',4,4'-diphenylsulfonetetracarboxylic acid dianhydride, 2,2-bis(3,4,-dicarboxyphenyl)hexafluoroisopropylidine is dianhydride, 3,3',4,4'-biphenyltetracarboxylic acid dianhydride, 3,3',4,4'-benzophenonetetracarboxylic acid dianhyride, 4,4'-hexafluoroisopropylidenediphthalic acid dianhydride, 3,3',4,4'-diphenylsulfonetetracarboxylic acid dianhydride, 1,2,3,4-cyclobutanetetracarboxylic acid dianhydride, 1,2,-dimethyl-1,2,3,4-cyclobutanetetracarboxylic acid dianhydride, 1,2,3,4-tetramethyl-1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4,-dicarboxy-1,2,3,4-tetrahydro-1-naphthalane succinic acid dianhydride, 5-(2,5-dioxotetrahydrofuryl)-3-methyl-3-cyclohexene-1,2,-dicarboxylic acid dianhydride, 2,3,5-tricarboxy-2-cyclopentane acetic acid dianhydride, bicycle[2,2,2]octo-7-en-2,3,5,6-tetracarboxilic acid dianhydride, 2,3,4,5-tetrahydropuranetetracarboxylic acid dianhydride, and 3,5,6-tricarboxy-2-norbornane acetic acid dianhydride, and their derivatives.

In order to accomplish the above objects, there is also provided a polyimide resin prepared by using a solvent having a low boiling point ranging from 130° C. to 180° C.

A glass transition temperature of the polyimide may range from 150° C. to 400° C.

A weight-average molecular weight of the polyimide resin may range from 1,000 to 100,000.

The amount of a catalyst remaining in the polyimide resin may be 0.001 wt % to 0.1 wt % of a total weight of the polyimide resin.

In order to accomplish the above objects, there is also provided a photosensitive resin composition which is curable at a low temperature and includes the polyimide resin prepared according to the foregoing method.

The photosensitive resin composition may be curable at a temperature ranging from 150° C. to 250° C.

After the photosensitive resin composition is cured, there is no solvent remaining in the photosensitive resin composition.

After the photosensitive resin composition is cured, a solvent remaining in the photosensitive resin composition may be less than 0.05 wt %.

A photosensitive film using the photosensitive resin composition may be removed by an edge bead removal solvent after prebaken.

When a drain is mixedly used, the photosensitive resin composition is dissolved without causing a precipitation.

An ink composition for printing, including the polyimide resin prepared according to the foregoing method may be provided.

In order to accomplish the above objects, there is also provided an ink composition for printing, including the polyimide resin prepared according to the foregoing method.

An OLED, an LCD, or a semiconductor insulating layer fabricated to include the photosensitive resin composition may be provided.

Also, an OLED, an LCD, or a semiconductor insulating layer fabricated to include the ink composition for printing may be provided.

A polyimide resin can be directly prepared by using a low boiling point solvent, without performing a process of preparing a polyamic acid, a polyimide precursor.

Also, the thusly prepared polyimide resin is curable even at a low temperature, so when the polyimide resin is used as an electronic material, damage to equipment due to an otherwise high temperature process can be minimized, and in addition, the polyimide resin can be extensively used as an electronic material such as for a plastic substrate, or the like.

The polyimide resin according to the preparation method of the present invention has a sufficient mechanical strength, excellent processability, and high production efficiency, so it can be advantageously used for a photosensitive resin composition of various displays, an ink composition for printing, or the like.

When the polyimide resin according to an exemplary embodiment of the present invention is included in a photosensitive resin composition so as to be used as a photosensitive film of an electronic material, it can be easily removed by an edge bead removal (EBR) solvent even at a low temperature after pre-baken.

In addition, when mixed with a drain, the photosensitive resin composition including the polyimide resin according to an exemplary embodiment of the present invention can be dissolved without causing a precipitation.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
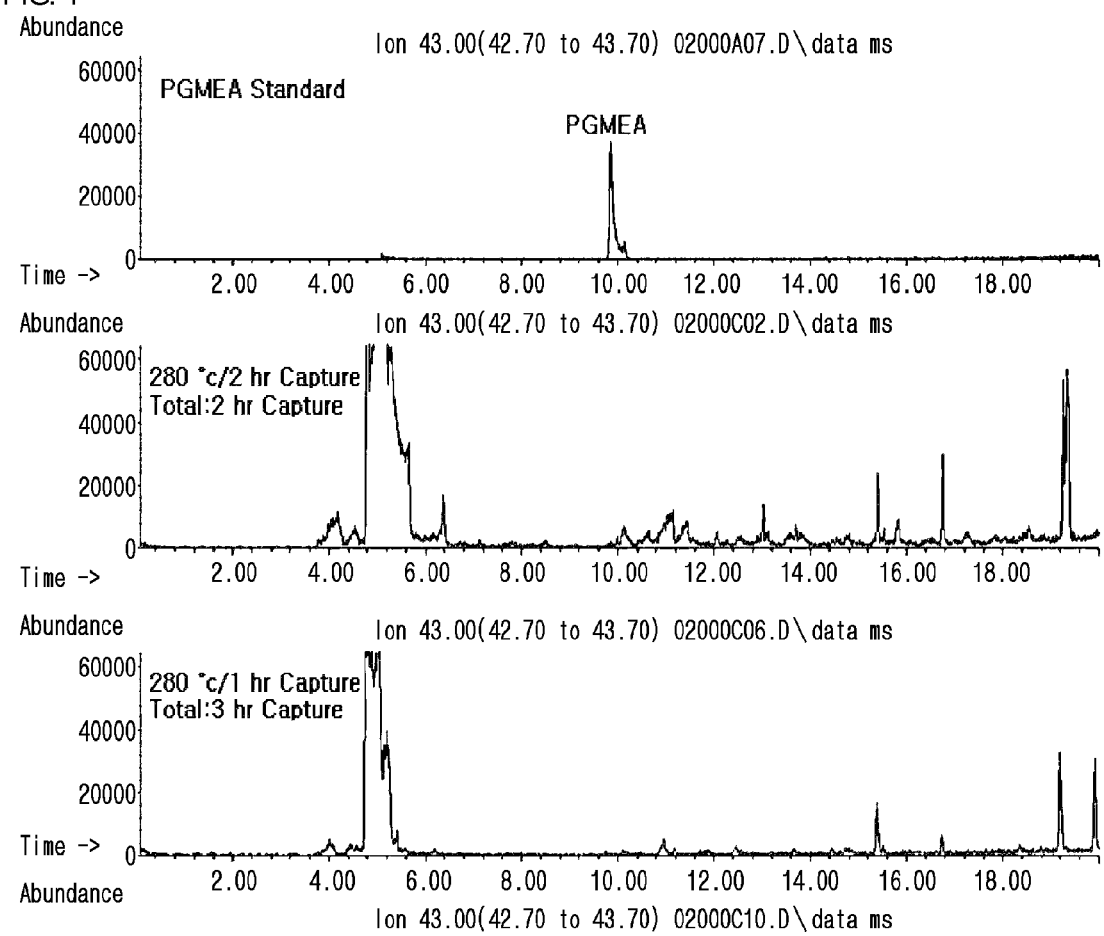
FIGS. 1 and 2 are graphs showing the analysis of remaining amount of solvents after photosensitive resin compositions according to an embodiment of the present invention and a comparative example are cured.

Exemplary embodiments of the present invention will now be described.

The terms used in the present application are merely used to describe particular embodiments, and are not intended to limit the present invention. An expression used in the singular encompasses the expression of the plural, unless it has a clearly different meaning in the context in which it is used.

In the present application, it is to be understood that the terms such as "comprise" or "comprising" etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

In the present exemplary embodiment, in preparing a polyimide resin by reacting diamine and dianhydride, a particular catalyst and solvent having a low boiling point are used to thus prepare a polyimide resin which can be cured at a low temperature and is soluble.

The polyimide resin according to the present exemplary embodiment is directly prepared from diamine and dianhydride, rather than being prepared as a polyimide film by preparing a polyamic acid precursor from diamine and dianhyride (dianhydrides) and curing the same as in the related art.

The present invention has the characteristics in that a solvent having a low boiling point ranging from 130° C. to 180° C. is used in order to allow the polyimide resin to be synthesized at a low temperature.

In general, a polyimide resin is prepared by preparing a polyamic acid precursor and curing the precursor at a temperature of 320° C. or higher. Comparatively, in the present exemplary embodiment, the polyimide resin is directly prepared, without performing the process of preparing the polyamic acid precursor, and the low boiling point solvent is used to allow the polyimide resin to be synthesized at a lower temperature than that of the related art.

As described above; the solvent having a low boiling point ranging from 130° C. to 180° C. may be, for example, one or more selected from the group consisting of diethyleneglycol methylethylether, diethyleneglycol dimethylether, diethyleneglycol diethylether, dipropyleneglycol dimethylether, methyl 3-methoxy propionate, ethyl 3-ethoxy propionate, propylene glycol methylether propionate, dipropyleneglycol dimethylether, cyclohexanone, and propyleneglycolmonomethyletheracetate (PGMEA), but the present invention is not limited thereto and any solvent may be used so long as it has a low boiling point within the foregoing temperature range.

If the boiling point of the solvent according to the present exemplary embodiment is lower than 130° C., it would not be able to provide sufficient energy to prepare polyimide, potentially degrading a conversion rate. In addition, if the boiling point of the solvent does not exceed 180° C., temperature of 200° C. or higher must be provided for a curing operation to prevent the solvent from remaining, causing a problem in that the curing temperature cannot be lowered.

The low boiling point solvent may be contained by 20 weight parts to 2000 weight parts, preferably, by 100 weight parts to 1000 weight parts, most preferably, by 200 weight parts to 400 weight parts over a total 100 weight parts of monomers including diamine and dianhyride. If content of the solvent is less than 20 weight parts, polyimide cannot be sufficiently dissolved, and if content of the solvent exceeds 2000 weight parts, when it is coated on a substrate, a coated film having a sufficient thickness cannot be formed.

In the present exemplary embodiment, in preparing the polyimide resin, a low boiling point catalyst can be contained.

As the catalyst, a catalyst, which can be imidized at a low temperature, can be easily removed after reaction, has a low boiling point, and has a high reactivity, can be desirably used.

In detail, the catalyst has a boiling point ranging from 60° C. to 120° C., preferably, 70° C. to 100° C., and most preferably, 80° C. to 90° C. If the boiling point of the catalyst is lower than 60° C., the catalyst would be entirely evaporated during polymerization, while if the boiling point of the catalyst is higher than 120° C., the catalyst having a high reactivity remains upon completion of the reaction, potentially causing a side reaction in preparing a composition.

The catalyst according to the present exemplary embodiment may be, for example, one or more selected from the group consisting of N,N-diethylmethylamine, N,N-dimethylisopropylamine, N-methylpyrrolidine, pyrrolidine, and triethylamine, but the present invention is not limited thereto.

The catalyst may be contained by 0.5 weight parts to 30 weight parts, preferably, 2 weight parts to 20 weight parts, and most preferably, 5 weight parts to 10 weight parts over a total 100 weight parts of monomers obtained by adding the diamine and dianhydride used for synthesizing the polyimide resin. If content of the catalyst is less than 0.5 weight parts, because the amount of the catalyst is insufficient, the rate of conversion into polyimide is lowered, and if content of the catalyst exceeds 30 weight parts, an addition reaction may undesirably occur due to a remaining non-reacted catalyst.

The diamine and dianhyride, monomers used in the polyimide resin according to the present exemplary embodiment, may be those used for preparing a general polyimide resin, without being particularly limited. In this case, those monomers may be selectively used for certain purposes.

For example, acid anhydrides or their derivatives may be one or more dianhydrides selected from the group consisting of one or more acid anhydrides selected from the group consisting of anhydrous pyromellitic acid, 3,3',4,4'-biphenyltetracarboxylic acid dianhydride, butane-1,2,3,4-tetracarboxylic acid dianhydride, 3,3',4,4'-benzophenonetetracarboxylic acid dianhydride, 3,3'4,4'-diphenylethertetracarboxylic dianhydride, 3,3',4,4'-diphenylsulfonetetracarboxylic acid dianhydride, 2,2-bis(3,4,-dicarboxyphenyl)hexafluoroisopropylidine dianhydride, 3,3',4,4'-biphenyltetracarboxylic acid dianhydride, 3,3',4,4'-benzophenonetetracarboxylic acid dianhyride, 4,4'-hexafluoroisopropylidenediphthalic acid dianhydride, 3,3',4,4'-diphenylsulfonetetracarboxylic acid dianhydride, 1,2,3,4-cyclobutanetetracarboxylic acid dianhydride, 1,2,-dimethyl-1,2,3,4-cyclobutanetetracarboxylic acid dianhydride, 1,2,3,4-tetramethyl-1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4,-dicarboxy-1,2,3,4-tetrahydro-1-naphthalane succinic acid dianhydride, 5-(2,5-dioxotetrahydrofuryl)-3-methyl-3-cyclohexene-1,2,-dicarboxylic acid dianhydride, 2,3,5-tricarboxy-2-cyclopentane acetic acid dianhydride, bicycle[2,2,2]octo-7-en-2,3,5,6-tetracarboxilic acid dianhydride, 2,3,4,5-tetrahydropuranetetracarboxylic acid dianhydride, and 3,5,6-tricarboxy-2-norbornane acetic acid dianhydride, As the diamine, aromatic and aliphatic diamine may be used, and diamine compounds may be, one or more aromatic diamines selected from the group consisting of bivalent organic groups including a phenolic hydroxyl group, a carboxyl group, or a hydroxyl group, such as bivalent organic groups derived from

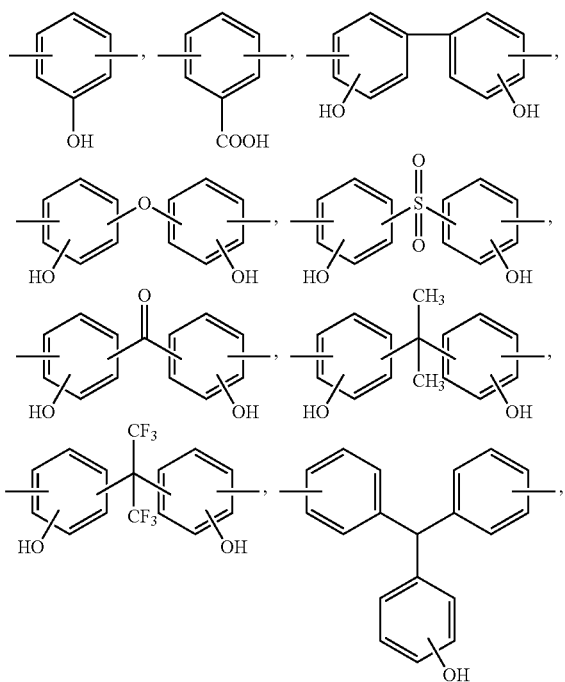

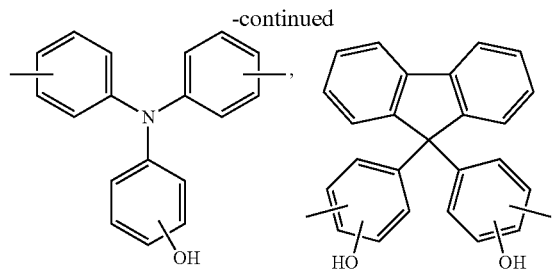

and a 3,5-diaminobenzoic acid; one or more aromatic diamines selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminophenylmethane, 3,3'-diaminodiphenylmethane, 4,4'-methylene-bis(2-methylaniline), 4,4'-methylene-bis(2-isopropyl-6-methylaniline), 4,4'-methylene-bis(2,6-didsopropylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-amoniphenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane, and one or more aliphatic diamines selected from the group consisting of 1,6-hexanedimane, 1,4-cyclohexanediamine, 1,3-cyclohexanedimane, 1,4-bix(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-amonipropyl)piperazine, 3,9-bis(3-amonopropyl)-2,4,8,10-tetraoxaspiro[5,5]undecane, and 1-3-bis(3-aminopropyl)tetramethyldisiloxane, and the aromatic diamines and aliphatic diamines may be mixed to be used but the present invention is not limited thereto.

Meanwhile, the polyimide resin according to the present exemplary embodiment may be polymerized at a low temperature ranging from 120° C. to 200° C., preferably, 130° C. to 180° C., and most preferably, 140° C. to 160° C.

When polyimide is prepared according to the foregoing process, preferably, a conversion rate in the event of polymerization is 100%, and the amount of the catalyst remaining in the polyimide resin is 0.001 wt % to 0.1 wt % of the polyimide resin.

Although the polyimide according to the present exemplary embodiment is polymerized at a relatively low temperature, it has a high conversion rate and the amount of catalyst remaining in the finally prepared polyimide resin is small, so it can be noted that the polyimide resin can be effectively prepared according to the preparation method according the present exemplary embodiment.

The polyimide resin prepared according to the sequential processes in the present exemplary embodiment can be cured at a low temperature range from 150° C. to 250° C. and is soluble.

Thus, the problems of the related art, such as the difficulty in the process for curing polyimide at a temperature of 320° C. or higher, the problem that it cannot be used for a process vulnerable to heat, the low conversion rate from the polyamic acid precursor solution to the polyimide resin in spite of the performing of the high temperature curing, and the like, can be solved.

In general, the solubility of the polyimide resin with respect to a solvent is known to be extremely limited, but the polyimide resin prepared according to the present exemplary embodiment has availability with respect to a solvent having a low solubility.

In general, because polyimide has a very low solubility, a monomer must be introduced to provide a solubility function to polyimide. Nevertheless, polyimide tends to be well dissolved in a high boiling point solvent having a high polarity.

However, the low temperature curable polyimide according to the present exemplary embodiment has excellent soluble characteristics and has excellent solubility with respect to the low boiling point solvent such as the solvent having a boiling point ranging from 130° C. to 180° C. used in the present invention.

Thus, in order to create an imide ring, there is no need to perform imidization at a high temperature after coating, and a polyimide film can be obtained by simply removing a solvent. Also, thanks to the high conversion rate through the chemical imidization in advance, the degradation of reliability of an element due to out-gassing generated from the non-imidized polyamic acid or to polyamic acid ester can be avoided. In particular, when the low boiling point solvent is in use, the temperature can be further lowered according to the boiling point of the solvent, so the solvent can be used for an element process that requires a low temperature process in order to form a thin film having a high mechanical and thermal stability such as that of the existing polymide.

A glass transition temperature of the polymide resin according to the present exemplary embodiment may range from 150° C. to 400° C. In addition, the polyimide resin may have a weight-average molecular weight of the polyimide resin ranges from 1,000 to 500,000, preferably, 5,000 to 100,000.

A low temperature curable photosensitive resin composition containing the polyimide resin prepared according to the foregoing method can be provided, and the photosensitive resin composition has the characteristics in that it can be curable at a low temperature ranging from 150° C. to 250° C.

As for the photosensitive resin composition according to the present exemplary embodiment, after the photosensitive resin composition is cured, the amount of a solvent remaining in the photosensitive resin composition is less than 0.05 wt %, and preferably, after the photosensitive resin composition is cured, there is no solvent (0 wt %) remaining in the photosensitive resin composition.

A photosensitive film using the photosensitive resin composition has characteristics in which it can be easily removed by an edge bead removal (EBR) solvent, after prebaked. The polymerization is performed by using a solvent such as a glyme-based solvent, propionate, PGMEA, and the like, which is generally used for photoresist but not used for a general polyimide polymerization, so the photosensitive film can be easily removed by the general EBR solvent at a low temperature.

Therefore, the photosensitive resin composition can be removed by using a general solvent used for a rework in the fabrication process in a semiconductor line or a display line such as an OLED, LCD, or the like, and when a drain is mixed used, the photosensitive resin composition can be dissolved without causing a precipitation, thus preventing a pipe from being blocked or the like.

In case of a composition for printing, solvents such as NMP, GBL, DMAc, DMF, or the like, used for a general polyimide polymerization cannot be used, but the polyimide resin according to the present exemplary embodiment can be advantageously used for a ink composition for printing because it does not use such solvents.

As a result, the polyimide resin according to the present exemplary embodiment can be used as a binder resin of photosensitive resin compositions of various electronic materials including OLED, LCD, and the like, and ink compositions for printing, but the present invention is not limited thereto.

Consequently, a polyimide film prepared by including the photosensitive resin composition or a polyimide film prepared by including the ink composition for printing according to the present exemplary embodiment can be provided, and in addition, an OLED, an LCD, or a semiconductor insulating layer fabricated by using the polyimide films can be provided.

The present invention will now be described in more detail. The exemplary embodiments of the present invention are provided to facilitate understanding of the present invention and should not be construed as limited to the accompanying drawings. The technical idea of the present invention should be interpreted to embrace all such alterations, modifications, and variations in addition to the accompanying drawings.

Embodiment 1

Example of Low Temperature Polyimide Polymerization 12.1 g of 2,2-bis(3-amino-4-hydroxyphenyl)hexafluoropropane and 60 g of propyleneglycolmonomethyletheracetate were sequentially put into a 100 ml round bottom flask, which were then slowly stirred so as to be completely dissolved. The flask was water-bathed, and then, 10.2 g of 3,3',4,4'-diphenylethertetracarboxylic acid dianhydride was slowly added while maintaining the flask at room temperature. 11 g of toluene and 4 g of triethylamine were put into the mixture solution and, in a state in which a dean-stark distillation device was installed to remove water, the mixture solution was refluxed at 150° C. for five hours. The water of the dean-stark distillation device was removed and the resultant mixture solution was additionally refluxed for two hours in order to remove a catalyst, which was then cooled at room temperature to obtain a soluble polyimide solution.

A polyimide generation peak was checked through IR, and it was confirmed that the weight-average molecular weight of the polyimide resin measured through GPC was 40,000 and a poly-disperse index (PDI) was 1.5.

Embodiment 2

Example of Low Temperature Polyimide Polymerization 12.1 g of 2,2-bis(3-amino-4-hydroxyphenyl)hexafluoropropane and 60 g of propyleneglycolmonomethyletheracetate were sequentially put into a 100 ml round bottom flask, which were then slowly stirred so as to be completely dissolved. The flask was water-bathed, and then, 6.5 g of 1,2,3,4-tetracarbonic acid dianhydride was slowly added while maintaining the flask at room temperature. 11 g of toluene and 4 g of triethylamine were put into the mixture solution and, in a state in which a dean-stark distillation device was installed to remove water, the mixture solution was refluxed at 150° C. for five hours. The water of the dean-stark distillation device was removed and the resultant mixture solution was additionally refluxed for two hours in order to remove a catalyst, which was then cooled at room temperature to obtain a soluble polyimide solution.

A polyimide generation peak was checked through IR, and it was confirmed that the weight-average molecular weight of the polyimide resin is measured through GPC was 35,000 and a poly-disperse index (PDI) was 1.7.

Comparative Example 1

Example of High Temperature Polyimide Polymerization 12.1 g of 2,2-bis(3-amino-4-hydroxyphenyl)hexafluoropropane and 60 g of γ-butyrolactone were sequentially put into a 100 ml round bottom flask, which were then slowly stirred so as to be completely dissolved. The flask was water-bathed, and then, 10.2 g of 3,3',4,4'-diphenylethertetracarboxylic acid dianhydride was slowly added while maintaining the flask at room temperature. The mixture solution was stirred for 16 hours at room temperature, and 7 g of toluene was put into the mixture solution and, in a state in which a dean-stark distillation device was installed to remove water, the mixture solution was refluxed at 180° C. for three hours. The water of the dean-stark distillation device was removed and the resultant mixture solution was additionally refluxed for two hours in order to remove a catalyst, which was then cooled at room temperature to obtain a soluble polyimide solution.

A polyimide generation peak was checked through IR, and it was confirmed that the weight-average molecular weight of the polyimide resin measured through GPC was 40,000 and a poly-disperse index (PDI) was 1.6.

Comparative Example 2

Example of Polyimide Precursor Polymerization 73.3 g of 4,4'-oxydianilene and 300 g of γ-butyrolactone were sequentially put into a 1 L round bottom jacket reactor, which were then slowly stirred so as to be completely dissolved. While maintaining the jacket temperature of the reactor at 20° C., 55.8 g of 3,3',4,4'-diphenylsulfonetetracarboxylic dianhydride was slowly added and stirred. The mixture solution was stirred for two hours so as to be sufficiently reacted, and then further stirred for 16 hours at room temperature to prepare polyamic acid. A polyamic acid generation peak was checked through IR, and it was confirmed that the weight-average molecular weight of the polyimide resin measured through GPC was 50,000 and a poly-disperse index (PDI) was 1.6.

Experimental Example 1

1. Evaluation of Imidization Rate

It was measured by using FT-IR in a case after prebaking at 120° C. for four minutes and in a case after hardbaking at 250° C. for one hour.
An imidization rate of each case was checked through a CN band integration value of a test sample cured at respective curing conditions on the assumption that a CN band integration value of a test sample cured at 300° C. for one hour is a 100% conversion rate.

TABLE 1

|  | After prebaking at 120° C. for four minutes | After hardbaking at 250° C. for one hour |
|---|---|---|
| Embodiment 1 | 100% | 100% |
| Embodiment 2 | 98% | 98% |
| Comparative Example 1 | 98% | 98% |
| Comparative Example 1 | 0% | 0% |

According to the results as shown in Table 1, it is noted that Embodiments 1 and 2 according to the present invention in which the polyimide resin was directly prepared at a low temperature have the same or superior imidization rate compared with the Comparative Example 1 in which the polyimide resin was prepared at a high temperature.

2. Analysis of Remaining Amount of Catalyst

The remaining amount of catalyst was quantitatively analyzed through GC-MS analysis, and the results are shown in Table 2 below.

|  | Amount of remaining catalyst |
|---|---|
| Embodiment 1 | Triethylamine 0.02% |
| Comparative Example 1 | Pyridine 0.5% |

As shown in Table 2, it is noted that when the low boiling point catalyst according to the present invention was used, the amount of catalyst remaining in the polyimide was remarkably reduced compared with that of the Comparative Example 1. Therefore, it can be noted, from the results, that the preparation of the polyimide according to the method of the present invention is effective.

Embodiment 3

Preparation Example of Photosensitive Resin Composition (Polyimide Composition)

0.5 g of a diazonaphthoquinone ester compound (for which OH and OD is selectively given according to the ratio of TPPA 320: OD/(OD/OH)=2/3) as a photo active compound and 4 g of propyleneglycolmonomethyletheracetate (PGMEA) were added to 1.6 g of the soluble polyimide synthesized in the foregoing Embodiment 1, which were then stirred for one hour at room temperature and filtered with a filter having a pore size of 1 µm to prepare a photosensitive resin composition.

Comparative Example 3

Preparation Example of Photosensitive Resin Composition (Polyimide Composition)

0.5 g of a diazonaphthoquinone ester compound (for which OH and OD is selectively given according to the ratio of TPPA 320: OD/(OD+OH)=2/3) as a photo active compound and 4 g of γ-butyrolactone (GBL) were added to 1.6 g of the soluble polyimide synthesized in the foregoing Comparative Example 1, which were then stirred for one hour at room temperature and filtered with a filter having a pore size of 1 µm to prepare a photosensitive resin composition.

Experimental Example 2

Analysis of Remaining Amount of Solvent

The compositions of Embodiment 3 and Comparative Example 3 were coated on a substrate and prebaked at 120° C. for two minutes and hard-baked at 200° C. for one hour to form coated films, respectively. The coated films were left at 280° C., and the amounts of solvents captured after two hours, three hours, and four hours were analyzed and indicated as shown in FIGS. 1 and 2.

Figure 2:
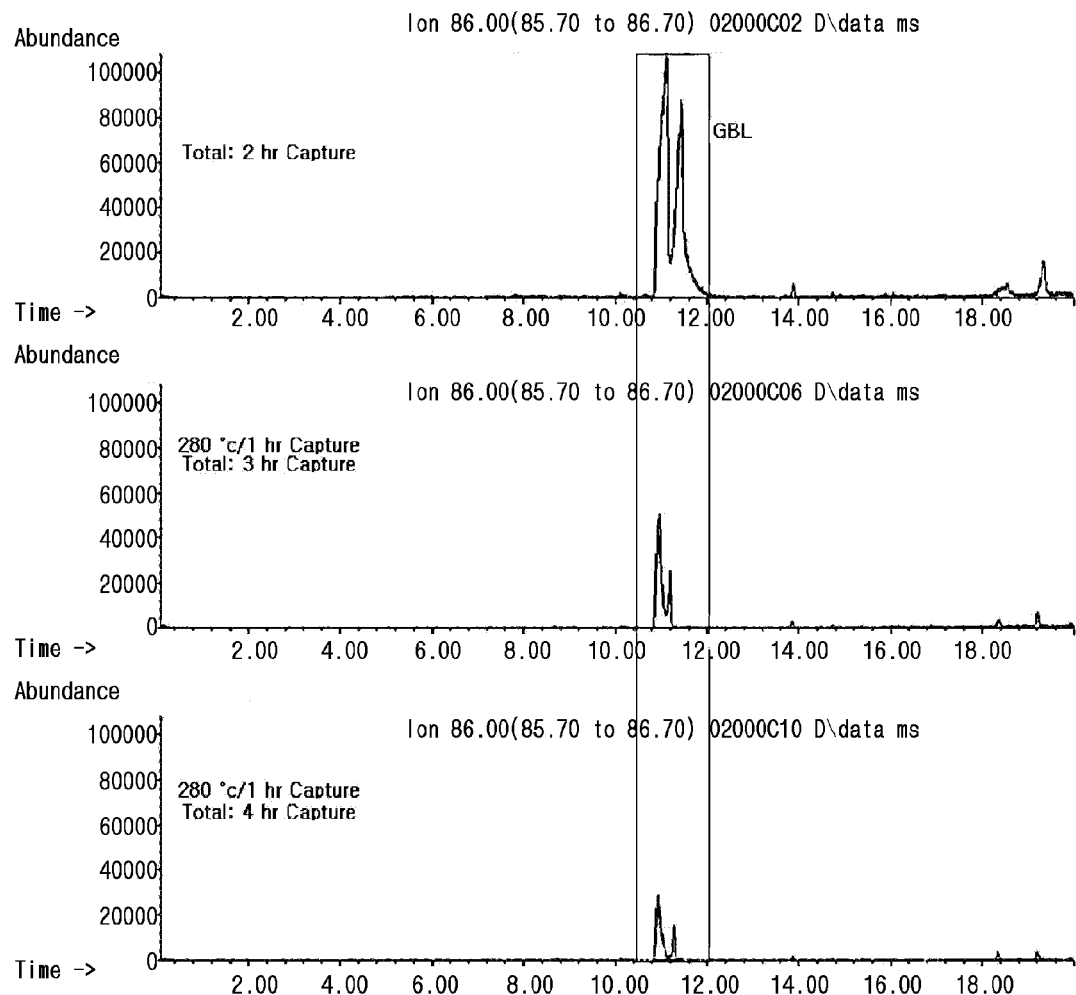

FIG. 1 is a graph showing the analysis of the remaining amount of the solvent according to Embodiment 3, and FIG. 2 a graph showing the analysis of the remaining amount of the solvent according to Comparative Example 3. As shown in FIG. 1, it is noted that there is no peak occurrence by the remaining solution in Embodiment 3 and only a peak according to decomposition of the composition. Meanwhile, in FIG. 2, it is noted that the peak of GBL is shown even when the solution was captured at 280° C. for four hours due to the peak according to the remaining solvent.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for preparing a polyimide resin, the method comprising:
   a polymerization process resulting in 10 ppm to 200 ppm of the catalyst in the soluble polyimide resin after polymerization process, the polymerization process having the steps of:
   polymerizing a soluble polyimide resin using a monomer comprising one or more dianhydrides and aromatic diamines including a phenolic hydroxyl group, a carboxyl group, or a hydroxyl group,
   under the presence of a catalyst of triethylamine having a boiling point ranging from about 60° C. to about 100° C. in a solvent having a boiling point ranging from about 130° C. to about 180° C., and
   refluxing said soluble polyimide resin in the solvent until the remaining amount of the catalyst in the soluble polyimide resin is 10 ppm to 200 ppm,
   wherein the soluble polyimide resin is directly prepared without performing a step for preparing a polyamic acid precursor,
   wherein the polymerization is performed at a temperature ranging from 120° C. to 160° C. for five hours or less,
   wherein the catalyst is used in the amount of 0.5 weight parts to 30 weight parts over 100 weight parts of the monomers, and
   wherein a weight average molecular weight of the polyimide resin ranges from 1,000 to 100,000.

2. The method of claim 1, wherein the solvent is one or more selected from the group consisting of diethyleneglycol methylethylether, diethyleneglycol dimethylether, diethyleneglycol diethylether, dipropyleneglycol dimethylether, methyl 3-methoxy propionate, ethyl 3-ethoxy propionate, propylene glycol methylether propionate, dipropyleneglycol dimethylether, cyclohexanone, and propyleneglycolmonomethyletheracetate (PGMEA).

3. The method of claim 1, wherein the solvent is used in the amount of 20 weight parts to 2000 weight parts over 100 weight parts of the monomer for preparing a polyimide resin.

4. The method of claim 1, wherein the aromatic diamines have a bivalent organic group selected from the group consisting of

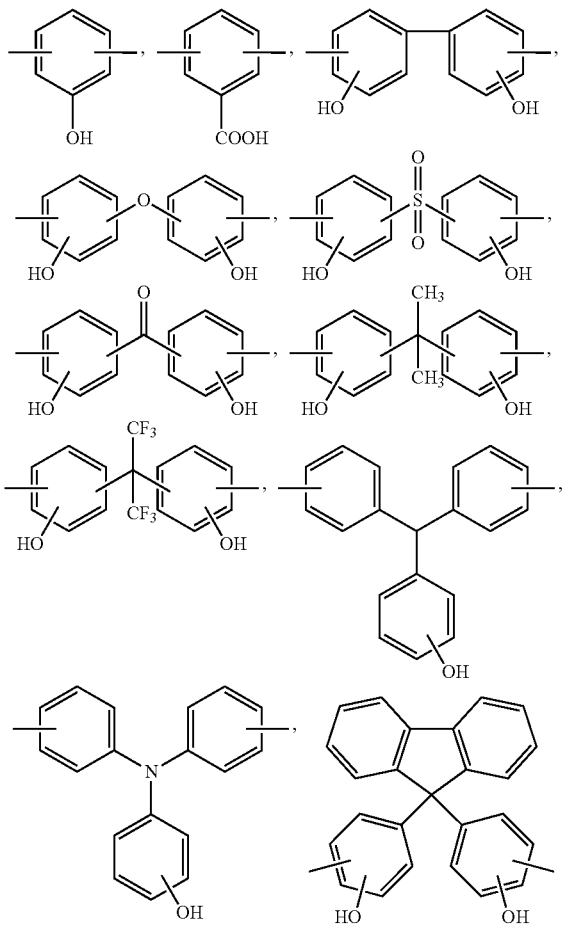

and a 3,5-diaminobenzoic acid.

5. The method of claim 1, wherein the monomer further comprises one or more aromatic or aliphatic diamines selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminophenylmethane, 3,3'-diaminodiphenylmethane, 4,4'-methylene-bis(2-methylaniline), 4,4'-methylene-bis(2-isopropyl-6-methylaniline), 4,4'-methylene-bis(2,6-didsopropylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-amoniphenoxy)benzene, 1,3-bis(4-aminophenoxy)benzene, 1,3-bis(3-aminophenoxy)benzene, bis[4-(4-aminophenoxyl)phenyl]sulfone, bis[4-(3-aminophenoxyl)phenyl]sulfone, 2,2-bis[4-(4-aminophenoxyl)phenyl]propane, 2,2-bis[4-(3-aminophenoxyl)phenyl]propane, 1,6-hexanediamine, 1,4- cyclohexanediamine, 1,3-cyclohexanediamine, 1,4-bix(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxyl)ethane, bis(3-aminopropyl)ether, 1,4-bis(3-amonipropyl)piperazine, 3,9-bis(3-amonopropyl)-2,4,8,10-tetraoxaspiro[5,5]undecane, and 1-3-bis(3-aminopropyl)tetramethyldisiloxane.

6. The method of claim 1, wherein the dianhydrides are selected from the group consisting of one or more acid anhydrides selected from the group consisting of anhydrous pyromellitic acid, 3,3',4,4'-biphenyltetracarboxylic acid dianhydride, butane-1,2,3,4-tetracarboxylic acid dianhydride, 3,3',4,4'-benzophenonetetracarboxylic acid dianhydride, 3,3'4,4'-diphenylethertetracarboxylic dianhydride, 3,3',4,4'-diphenylsulfonetetracarboxylic acid dianhydride, 2,2-bis(3,4,-dicarboxyphenyl)hexafluoroisopropylidine dianhydride, 3,3',4,4'-biphenyltetracarboxylic acid dianhydride, 3,3',4,4'-benzophenonetetracarboxylic acid dianhydride, 4,4'-hexafluoroisopropylidenediphthalic acid dianhydride, 3,3',4,4'-diphenylsulfonetetracarboxylic acid dianhydride, 1,2,3,4-cyclobutanetetracarboxylic acid dianhydride, 1,2,-dimethyl-1,2,3,4-cyclobutanetetracarboxylic acid dianhydride, 1,2,3,4-tetramethyl-1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4,-dicarboxy-1,2,3,4-tetrahydro-1-naphthalane succinic acid dianhydride, 5-(2,5-dioxotetrahydrofuryl)-3-methyl-3-cyclohexene-1,2,-dicarboxylic acid dianhydride, 2,3,5-tricarboxy-2-cyclopentane acetic acid dianhydride, bicycle[2,2,2]octo-7-en-2,3,5,6-tetracarboxilic acid dianhydride, 2,3,4,5-tetrahydropuranetetracarboxylic acid dianhydride, and 3,5,6-tricarboxy-2-norbornane acetic acid dianhydride, and their derivatives.

* * * * *